(12) United States Patent
Miyatake et al.

(10) Patent No.: US 11,069,384 B2
(45) Date of Patent: Jul. 20, 2021

(54) APPARATUSES AND METHODS FOR COMPENSATION OF SENSE AMPLIFIERS

(71) Applicant: MICRON TECHNOLOGY, INC., Boise, ID (US)

(72) Inventors: Shinichi Miyatake, Sagamihara (JP); Michael A. Shore, Boise, ID (US); Adam J. Grenzebach, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/372,000

(22) Filed: Apr. 1, 2019

(65) Prior Publication Data

US 2020/0312384 A1 Oct. 1, 2020

(51) Int. Cl.
*G11C 11/4091* (2006.01)
*G11C 7/08* (2006.01)

(52) U.S. Cl.
CPC ............ *G11C 7/08* (2013.01); *G11C 11/4091* (2013.01)

(58) Field of Classification Search
CPC .................................................. G11C 11/4091
USPC ........................................................ 365/205
See application file for complete search history.

(56) References Cited

U.S. PATENT DOCUMENTS

| 5,208,776 | A | * | 5/1993 | Nasu | G11C 29/83 327/295 |
| 6,181,621 | B1 | * | 1/2001 | Lovett | G11C 7/065 365/205 |
| 6,242,936 | B1 | * | 6/2001 | Ho | G01R 31/3004 324/762.02 |
| 8,598,912 | B2 | | 12/2013 | Thompson et al. | |
| 2008/0175084 | A1 | * | 7/2008 | Akiyama | H01L 27/10897 365/208 |
| 2011/0002152 | A1 | * | 1/2011 | Lane | G11C 29/04 365/51 |
| 2011/0304358 | A1 | * | 12/2011 | Thompson | G11C 11/4091 327/52 |
| 2018/0315466 | A1 | * | 11/2018 | Derner | G11C 11/4096 |

* cited by examiner

*Primary Examiner* — Muna A Techane
(74) *Attorney, Agent, or Firm* — Dorsey & Whitney LLP (57) ABSTRACT

Apparatuses and methods for compensation of sense amplifiers, for example, threshold voltage compensation, are disclosed. Prime memory sense amplifiers used for accessing prime memory and redundant memory sense amplifiers used for accessing redundant memory are concurrently compensated while determining whether a memory address is remapped from prime memory to redundant memory. Following the determination, sense amplifiers (e.g., prime memory sense amplifiers and/or redundant memory sense amplifiers) that are not used for accessing the memory corresponding to the memory address are precharged.

20 Claims, 6 Drawing Sheets

APPARATUSES AND METHODS FOR COMPENSATION OF SENSE AMPLIFIERS

BACKGROUND

Memory devices are structured to have one or more arrays of memory cells that are arranged, at least logically, in rows and columns. Each memory cell stores data as an electrical charge that is accessed by a digit line associated with the memory cell. When a memory cell is accessed, the change in voltage on the digit line due to the electrical charge may be sensed and amplified by a sense amplifier to indicate the value of the data state stored in the memory cell.

Conventional sense amplifiers are typically coupled to a pair of complementary digit lines to which a large number of memory cells (not shown) are connected. A voltage difference created between the pair of digit lines by the electrical charge of the accessed memory cell is sensed and amplified by a sense amplifier during a sensing operation. However, random threshold voltage mismatch of transistor components of the sense amplifier can cause the sense amplifier to erroneously amplify input signals.

Threshold voltage compensation circuits may be included with the sense amplifiers to compensate for threshold voltage differences between components of the sense amplifiers. Compensating for threshold voltage differences between circuit components within the sense amplifier may mitigate effects of small variances in the performance between circuit components of the sense amplifiers (e.g., due to process, voltage, and temperature (PVT) variance) and improve reliability.

Compensating sense amplifiers typically require additional time during access operations, however. The additional time needed to compensate sense amplifiers may delay access times and slow down the rate at which data is provided, which may be undesirable.

Therefore, it may be desirable to improve access times for access operations that include sense amplifier compensation.

DETAILED DESCRIPTION

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
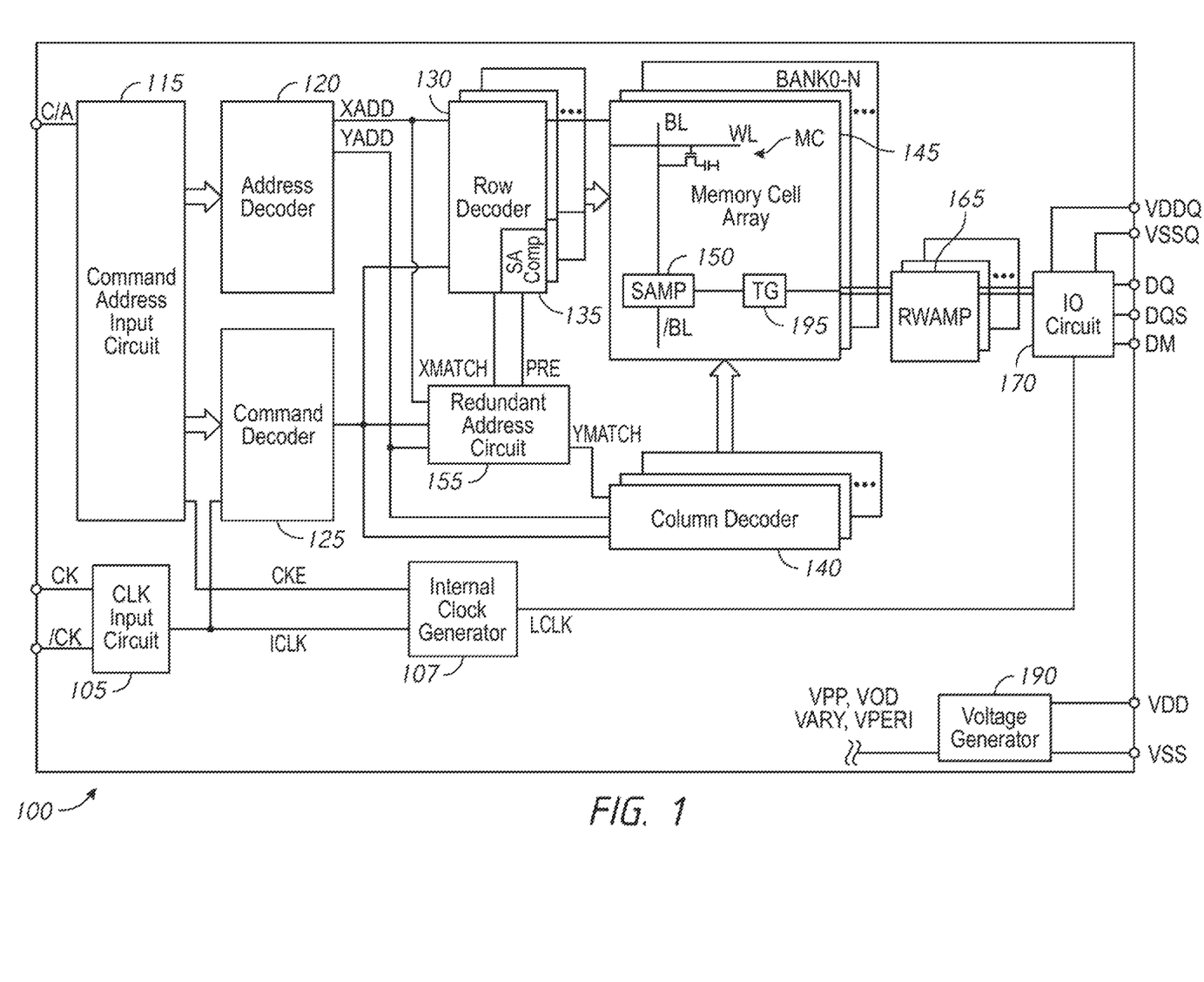
FIG. 1 is a schematic block diagram of a semiconductor device according to an embodiment of the disclosure.

FIG. 1 is a schematic block diagram of a semiconductor device 100, in accordance with an embodiment of the present disclosure. The semiconductor device 100 may include a clock input circuit 105, an internal clock generator 107, an address command input circuit 115, an address decoder 120, a command decoder 125, a plurality of row (e.g., first access line) decoders 130, a memory cell array 145 including sense amplifiers 150 and transfer gates 195, a plurality of column (e.g., second access line) decoders 140, a plurality of read/write amplifiers 165, an input/output (I/O) circuit 170, and a voltage generator 190. The semiconductor device 100 may include a plurality of external terminals including address and command terminals coupled to command/address bus 110, clock terminals CK and /CK, data terminals DQ, DQS, and DM, and power supply terminals VDD, VSS, VDDQ, and VSSQ. The terminals and signal lines associated with the command/address bus 110 may include a first set of terminals and signal lines that are configured to receive the command signals and a separate, second set of terminals and signal lines that configured to receive the address signals, in some examples. In other examples, the terminals and signal lines associated with the command and address bus 110 may include common terminals and signal lines that are configured to receive both command signal and address signals. The semiconductor device may be mounted on a substrate, for example, a memory module substrate, a motherboard or the like.

The memory cell array 145 includes a plurality of banks BANK0-N, where N is a positive integer, such as 3, 7, 15, 31, etc. Each bank BANK0-N may include a plurality of word lines WL, a plurality of digit lines DL, and a plurality of memory cells MC arranged at intersections of the plurality of word lines WL and the plurality of digit lines DL. The word lines may generally correspond to rows of memory and the digit lines DL may generally correspond to columns of memory. The memory cell array 145 includes memory designated as prime memory and designated as redundant memory. Memory addresses corresponding to prime memory may be remapped to redundant memory. For example, when the prime memory is defective, the memory address for the defective prime memory may be remapped to functional redundant memory, thereby repairing the defective prime memory.

The selection of the word line WL for each bank BANK0-N is performed by a corresponding row decoder 130 and the selection of the digit line DL is performed by a corresponding column decoder 140. The plurality of sense amplifiers 150 are coupled to corresponding digit lines DL and coupled to at least one respective local I/O line pairs LIOT/B. The local I/O line is coupled to a respective one of at least two main I/O line pairs MIOT/B, via transfer gates TG 195, which function as switches. The sense amplifiers 150 and transfer gates TG 195 may be operated based on control signals from decoder circuitry, which may include the command decoder 120, the row decoders 130, the column decoders 140, any control circuitry of the memory cell array 145 of the banks BANK0-N, or any combination thereof.

In some examples, the plurality of sense amplifiers 150 may include threshold voltage compensation circuits that compensate threshold voltage differences between components of the sense amplifiers 150. As circuit components become smaller, clock speeds become faster, and voltage/power consumption requirements are reduced, small variances in the performance between circuit components of the sense amplifiers 150 (e.g., due to process, voltage, and temperature (PVT) variance) may reduce operational reliability of the semiconductor device 100. To mitigate effects of these variations, compensating for some of these threshold voltage Vt differences may include, before activating the sense amplifier 150 to sense data in preparation for an access operation (e.g., read operation, write operation, etc.), biasing digit lines DL and DLb coupled to the sense amplifiers 150 using internal nodes of the sense amplifier 150 that are configured to provide sensed data to an output (e.g., gut nodes). The bias of the digit lines DL and DLb may be based on threshold differences between at least two circuit components (e.g., transistors) of the sense amplifier 150. While compensating for threshold voltage Vt differences between circuit components within the sense amplifier 150 may improve reliability.

Sense amplifier threshold voltage compensation may be controlled at least in part by sense amplifier compensation control circuits 135. The sense amplifier compensation control circuits 135 may control circuits used for the compensation operation. In some embodiments of the disclosure, the sense amplifier compensation control circuits 135 may control compensation circuits to concurrently compensate sense amplifiers for accessing prime memory and for accessing redundant memory. For example, in some embodiments of the disclosure, the sense amplifier compensation control circuits 135 may control when sense amplifier compensation is initiated and when sense amplifiers are returned to an inactive state (e.g., precharged).

The command/address input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The command/address input circuit 115 may receive a command signal from outside, such as, for example, a memory controller 105 at the command/address terminals via the command/address bus 110 and provide the command signal to the command decoder 125. The command decoder 125 may decode the command signal and generate various internal command signals. The internal command signals may be used to control operation and timing of various circuits of the semiconductor device 100. For example, the internal command signals may include row and column command signals to control circuits to perform access operations to selected word lines and digit lines, such as a read command or a write command.

Accordingly, when a row activation command is issued to the semiconductor device 100 and a bank address and row address are timely supplied with the activation command, and a column address is timely supplied with a read command, a read operation may be performed. The row address and column address are evaluated (e.g., compared to stored defective addresses) to determine whether to access prime memory or redundant memory. Once confirmed, the read data is read from a memory cell in the memory cell array 145 designated by the row address and the column address. The read/write amplifiers 165 may receive the read data DQ and provide the read data DQ to the 10 circuit 170. The IO circuit 170 may provide the read data DQ to outside via the data terminals DQ, DQS and DM together with a data strobe signal at DQS and a data mask signal at DM. Similarly, when the row activation command is issued to the semiconductor device 100 and a bank address and a row address are timely supplied with the activation command, and a column address is timely supplied with a write command, a write operation is performed. The row address and column address are evaluated to determine whether to access prime memory or redundant memory. The input/output circuit 170 may receive write data at the data terminals DQ, DQS, DM, together with a data strobe signal at DQS and a data mask signal at DM and provide the write data via the read/write amplifiers 165 to the memory cell array 145. The write data may be written in the memory cell designated by the row address and the column address.

To help ensure the reliability of the semiconductor device 100, memory cells of the memory cell array 145 are tested to detect defective cells. Typically, to repair a row or column of memory (e.g., row or column of prime memory), the memory cell array 145 may include rows and columns of redundant memory that can be swapped for a defective row or column of memory, respectively. In order to maintain which rows or columns have been replaced, the semiconductor device 100 may include the redundant address circuit 155. The redundant address circuit 155 may include circuits for each bank of the memory cell array 145.

The redundant address circuit 155 may include circuits that is configured to store row addresses and column addresses that correspond to rows or columns of prime memory that have been determined to be defective. The redundant address circuit 155 may also include circuits that compares the row address XADD with stored defective row addresses (e.g., and/or compares the column address YADD with stored defective column addresses) to detect a match. The redundant address circuit 155 may provide an active XMATCH signal to the row decoder 130 in response to detecting that a memory rows associated with the row address XADD is defective based on the comparison and may provide an active YMATCH to the column decoder 140 in response to detecting that a memory column associated with the column address YADD is defective based on the comparison.

In response to the active XMATCH signal, the row decoder 130 may redirect the row address XADD to a replacement row address associated with a row of redundant memory in the memory cell array 145 when performing previously discussed operations. Similarly, in response to the active YMATCH signal, the column decoder 140 may redirect the column address YADD to a replacement column address associated with a column of redundant memory in the memory cell array 145 when performing previously discussed operations.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170. The 10 circuit 170 may use the phase controller internal clock signal LCLK as a timing signal for determining an output timing of read data.

The power supply terminals may receive power supply voltages VDD and VSS. These power supply voltages VDD and VSS may be supplied to a voltage generator circuit 190. The voltage generator circuit 190 may generate various internal voltages, VPP, VOD, VBLP, NSA_BIAS, VARY, VPERI, and the like based on the power supply voltages VDD and VSS. The internal voltage VPP is mainly used in the row decoder 130, the internal voltages VOD, VBLP, NSA_BIAS, and VARY are mainly used in the sense amplifiers 150 included in the memory cell array 145, and the internal voltage VPERI is used in many other circuit blocks. The IO circuit 170 may receive the power supply voltages VDD and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

Figure 2:
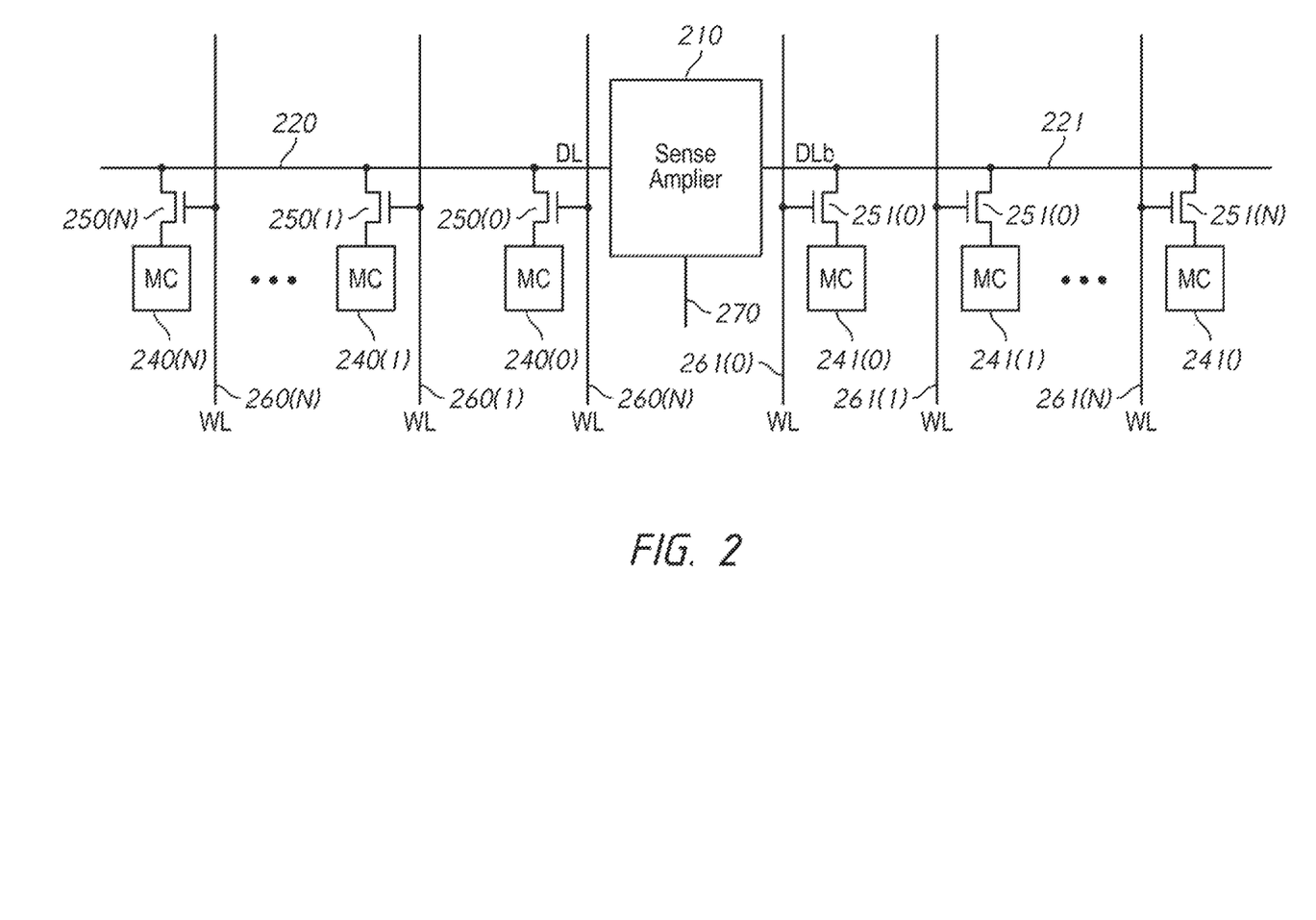
FIG. 2 is a schematic diagram of a sense amplifier and a pair of complementary digit lines according to an embodiment of the disclosure.

FIG. 2 is a schematic diagram of a portion of a memory 200 that includes a sense amplifier 210 and a pair of complementary digit lines DL 220 and DLb 221 according to an embodiment of the disclosure. As shown in FIG. 2, the sense amplifier 210 is coupled to the pair of true and complementary digit (or bit) lines DL 220 and DLb 221. The memory cells 240(0)-(N) may be selectively coupled through respective access devices (e.g., transistors) 250(0)-(N) to the digit line DL 220 and memory cells 241(0)-(N) may be selectively coupled through respective access devices (e.g., transistors) 251(0)-(N) to the digit line DLb 221. Wordlines WL 260(0)-(N) may control which of the memory cells 240(0)-(N) is coupled to the digit line DL 220 by controlling a gate of a respective access device 250(0)-(N). Similarly, wordlines WL 261(0)-(N) may control which of the memory cells 241(0)-(N) is coupled to the digit line DLb 221 by controlling a gate of a respective access device 251(0)-(N). The sense amplifier 210 may be controlled via control signals 270 received via a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuits (e.g., the control circuits of the memory cell array 145 of the memory banks BANK0-N of FIG. 1), or any combination thereof.

In some examples, sense amplifier 210 includes threshold voltage compensation circuits that compensate for threshold voltage mismatches between components of the sense amplifier 210 during a threshold voltage compensation phase. To perform the threshold voltage compensation, the sense amplifier 210 may, during a threshold voltage compensation phase, precharge or bias the digit lines DL 220 and DLb 221 such that a voltage difference between the digit line DL 220 and the DLb 221 is approximately equal to threshold voltage differences between at least two circuit components of the sense amplifier 210. In some examples, the threshold voltage difference may be based on threshold voltages of transistors of the sense amplifier 210. Compensating for threshold voltage Vt differences between circuit components within the sense amplifier 210 may improve reliability.

A wordline WL of the wordlines WL 260(0)-(N) and 261(0)-(N) may be set to an active state, and, in response, an access device of the access devices 250(0)-(N) and 251(0)-(N) may be enabled to couple a respective memory cell of the memory cells 240(0)-(N) and 241(0)-(N) to one of the digit lines DL 220 and DLb 221. The sense amplifier 210 may be activated to perform a sense operation to sense a data state of the coupled memory cell. That is, during a sense operation, a data state stored by the coupled memory cell is sensed and amplified by the sense amplifier 210 to drive one of the digit line DL 220 or the digit line DLb 221 to a high or low voltage level corresponding to the sensed data state and to drive the other digit line of the digit lines DL 220 and DLb 221 to the complementary voltage level during the sense operation.

Similarly, a memory cell of the memory cells 241(0)-(N) is coupled to the digit line DLb 221 through the respective access device 251(0)-(N) in response to a respective word line 261(0)-(N) becoming active. A data state stored by the memory cell is sensed and amplified by the sense amplifier 210 to drive the digit line DLb 221 to a high or low voltage level corresponding to the sensed data state. The other digit line DL 220 is driven to the complementary voltage level (e.g., the high voltage level is complementary to the low voltage level and the low voltage level is complementary to the high voltage level) during the sense operation.

Figure 3:
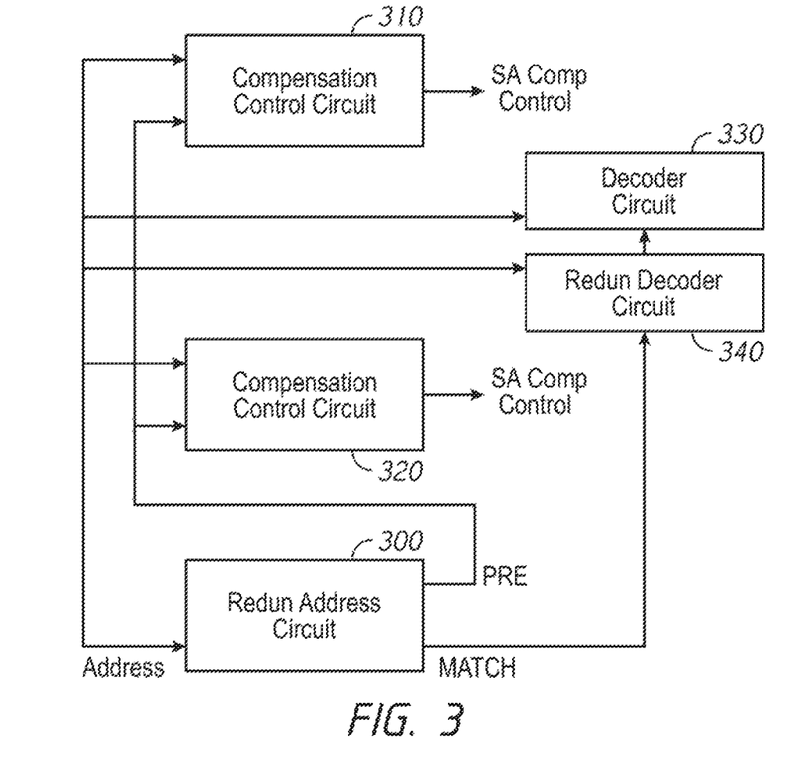
FIG. 3 is a block diagram of a redundant address circuit and sense amplifier compensation control circuits according to an embodiment of the disclosure.

FIG. 3 is a block diagram of a redundant address circuit 300 and sense amplifier compensation control circuits 310 and 320. In some embodiments of the disclosure, the redundant address circuit 300 and the sense amplifier compensation control circuits 310 and 320 may be included in the redundant address circuit 155 and included in the sense amplifier compensation control circuits 135, respectively, of the semiconductor device 100.

Memory addresses are received by the redundant address circuit 300 and the sense amplifier compensation control circuits 310 and 320 concurrently. Row addresses and/or column addresses are provided from an address decoder (e.g., address decoder 120 of FIG. 1), for example.

The compensation control circuits 310 and 320 activate compensation circuits to provide sense amplifier threshold voltage compensation for sense amplifiers that are used to access memory corresponding to the received memory addresses. The compensation circuits for sense amplifiers used to access prime memory (e.g., "prime memory" sense amplifiers) and the compensation circuits for sense amplifiers used to access at least a portion of redundant memory (e.g., "redundant memory" sense amplifiers) are concurrently activated by the compensation control circuits 310 and 320. Thus, concurrent threshold voltage compensation is performed for both prime memory sense amplifiers used for accessing prime memory and redundant memory sense amplifiers used for accessing redundant memory. In some embodiments of the disclosure, the compensation circuits that are activated for compensating sense amplifiers are based on the received memory address and/or physical location of the corresponding prime memory. In some embodiments of the disclosure, the compensation circuits for compensating sense amplifiers for all redundant memory are activated concurrently with the compensation circuits for compensating prime memory sense amplifiers. For example, in embodiments of the disclosure that include redundant memory in a section of memory that is accessed by one group of sense amplifiers, the compensation circuits for the group of sense amplifiers may be activated concurrently with the compensation circuits for the sense amplifiers used to access memory corresponding to a received memory address, thereby providing concurrent sense amplifier compensation.

The compensation control circuits 310 and 320 may also cause sense amplifiers to be precharged. Sense amplifiers are precharged to prepare them for a later access operation. For example, sense amplifiers that have been threshold voltage compensated in preparation for an access operation may be precharged to essentially return the sense amplifiers to a state prior to being compensated.

The redundant address circuit 300 compares the received memory addresses with redundant memory address information that identifies memory addresses that have been remapped from prime memory to redundant memory. In some embodiments of the disclosure, the address information is stored in non-volatile memory (e.g., fuses, antifuses, non-volatile memory cells, etc.) so that the remapped memory addresses are retained when power is not provided. The redundant memory address information is accessible by the redundant address circuit 300. In some embodiments of the disclosure, the address information may be stored in the redundant address circuit. In some embodiments of the disclosure, the address information is stored in another circuit that is accessible by the redundant address circuit 300. The redundant address circuit 300 may compare the received memory addresses with redundant memory address information while sense amplifier compensation occurs for sense amplifiers to access prime memory and redundant memory.

After comparing a received memory address with redundant memory address information, the redundant address circuit 300 provides an inactive signal MATCH (e.g., a low logic level) when a received address does not match any of the redundant memory address information, which indicates that the received memory address has not been remapped to redundant memory and the corresponding prime memory should be accessed. In contrast, the redundant address circuit 300 provides an active signal MATCH (e.g., a high logic level) when a received address matches any of the redundant memory address information, which indicates that the received memory address has been remapped to redundant memory and the redundant memory to which the received address has been mapped should be accessed.

The redundant address circuit 300 further provides precharge signals PRE to the compensation control circuits 310 and 320. Active precharge signals (e.g., logic high level) cause the compensation control circuits 310 and/or 320 to precharge sense amplifiers that may have been compensated by sense amplifier compensation operations. Conversely, inactive precharge signals (e.g., logic low level) cause the compensation control circuits 310 and/or 320 to not precharge sense amplifiers. In some embodiments of the disclosure, the redundant address circuit 300 provides precharge signals PRE to control the compensation control circuits 310 and 320 independently. For example, the redundant address circuit 300 may provide precharge signals PRE to cause compensation control circuit 310 to precharge sense amplifiers that may have already been compensated (e.g., precharge a first set of sense amplifiers), while the compensation control circuit 320 does not precharge sense amplifiers that may also have already been compensated (e.g., not precharge a second set of sense amplifiers). The redundant address circuit 300 may also provide precharge signals PRE to cause compensation control circuit 320 to precharge sense amplifiers that may have already been compensated (e.g., precharge the second set of sense amplifiers), while the compensation control circuit 310 does not precharge sense amplifiers that may also have already been compensated (e.g., not precharge the second set of sense amplifiers).

The memory addresses are also provided to a decoder circuit 330 and to a redundant memory decoder circuit 340. The decoder circuit 330 receives the memory addresses and accesses prime memory corresponding to a memory address when the memory address has not been remapped to redundant memory. The redundant memory decoder circuit 340 receives the memory addresses and accesses redundant memory corresponding to a memory address when the memory address has been remapped to redundant memory. The MATCH signal is provided to the decoder circuit 330 and the redundant memory decoder circuit 340 to identify whether a memory address has not been remapped to redundant memory (e.g., an inactive MATCH signal) or has been remapped to redundant memory (e.g., an active MATCH signal). Corresponding prime memory or redundant memory is then accessed accordingly.

In operation, the compensation control circuits 310 and 320 cause sense amplifier compensation for prime memory sense amplifiers and redundant memory sense amplifiers. The redundant address circuit 300 compares the received memory address with redundant memory address information while prime memory sense amplifiers and redundant memory sense amplifiers are compensated. The redundant address circuit 300 determines whether the received address matches redundant memory address information. Based on the results, the redundant address circuit 300 provides an active MATCH signal (e.g., indicating a match) or an inactive MATCH signal (e.g., indicating no match) to enable the decoder circuit 330 to access the prime memory corresponding to the received memory address or to enable the redundant memory decoder circuit 340 to access redundant memory to which the received memory address is remapped.

The redundant address circuit 300 further provides precharge signals PRE to the compensation control circuits 310 and 320 to cause the prime memory sense amplifiers to precharge and/or cause the redundant memory sense amplifiers to precharge. Which sense amplifiers are precharged may be based on the comparison of the received memory address with the redundant memory address information. For example, when the received memory address does not match any of the redundant memory address information, indicating that the memory address is not remapped and prime memory will be accessed, the redundant address circuit 300 provides the precharge signals PRE to cause the compensation control circuit 320 to precharge an associated group of sense amplifiers. The group of sense amplifiers may be precharged because the group of sense amplifiers will not be used to access memory for the memory address since prime memory will be accessed. When the received memory address does match any of the redundant memory address information, indicating that the memory address is remapped to redundant memory, the redundant address circuit 300 provides the precharge signals PRE to cause the compensation control circuit 310 to precharge an associated group of sense amplifiers. The group of sense amplifiers may be precharged because the group will not be used to access memory for the memory address since redundant memory will be accessed.

Memory access timing may be improved by having sense amplifier threshold compensation performed (e.g., for both prime memory sense amplifiers and redundant memory sense amplifiers) concurrently with memory address comparison by the redundant address circuit 300. For example, starting sense amplifier compensation before a determination is made whether to access prime memory or redundant memory for a received memory address avoids having to wait until after the determination is made before sense amplifier compensation can begin. Although additional power may be consumed due to compensating sense amplifiers that may not ultimately be used to access memory, overlapping the operations of sense amplifier compensation and memory address comparison may reduce overall time for accessing memory and/or provides greater timing margin for operations to complete, which may improve performance.

Figure 4A:
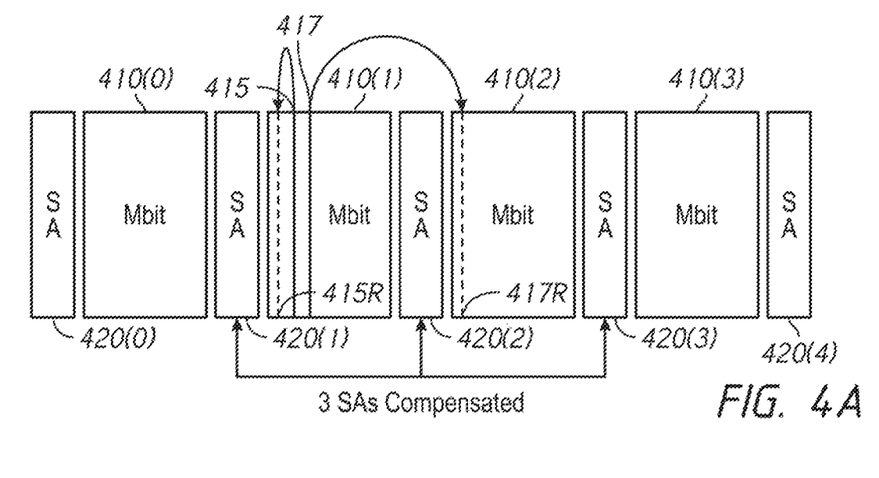
FIGS. 4A and 4B are diagrams of a portion of a memory cell array and sets of sense amplifiers for an example operation according to an embodiment of the disclosure.
Figure 4B:
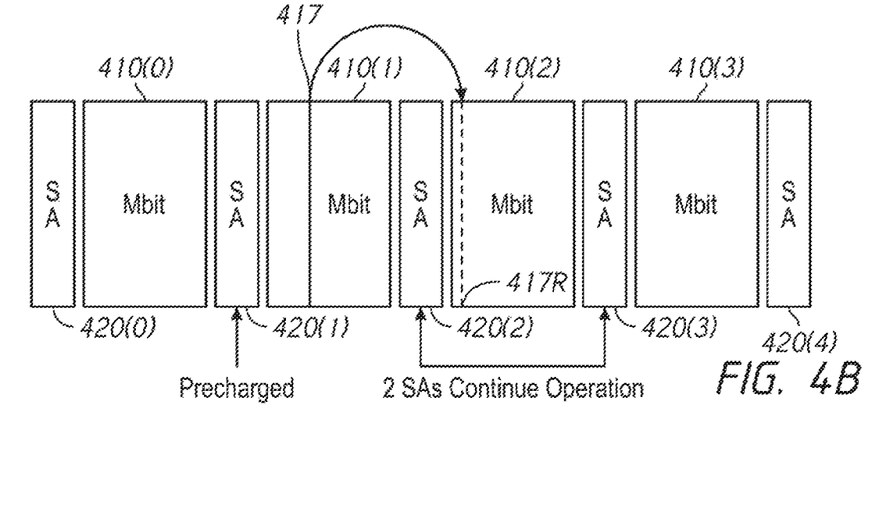

FIGS. 4A and 4B are diagrams of a portion of a memory cell array and sets of sense amplifiers for an example operation according to an embodiment of the disclosure. The memory cell array may be included in the memory cell array 145 of FIG. 1 and the sets of sense amplifiers may be included in the semiconductor device 100 in some embodiments of the disclosure.

The memory cell array is divided into memory cell sub-arrays (Mbit) 410(0)-410(3) which each include memory cells that may be accessed as rows and columns of memory. Each of the Mbits 410 include both prime memory and redundant memory.

Sets of sense amplifiers 420(0)-420(4) are shared by the Mbits 410 to access the memory cells. For example, the sense amplifiers 420(1) are used when accessing some of the memory cells in Mbit 410(0) and some of the memory cells in Mbit 410(1), the sense amplifiers 420(2) are used when accessing other ones of the memory cells in Mbit 410(1) and some of the memory cells in Mbit 410(2), and the sense amplifiers 420(3) are used when accessing other ones of the memory cells in Mbit 410(2) and some of the memory cells in Mbit 410(3). The sense amplifiers 420(0) are used when accessing other ones of the memory cells in Mbit 410(0) and the sense amplifiers 420(4) are used when accessing other ones of the memory cells in Mbit 410(3). In some embodiments of the disclosure, the sense amplifiers may have open digit line architecture. That is, the sense amplifiers may be coupled to a pair of digit lines, with each digit line extending into a different Mbit 410. In some embodiments, a set of sense amplifiers 420 includes prime memory sense amplifiers and redundant memory sense amplifiers.

In some embodiments of the disclosure, a memory address is limited to being remapped to redundant memory included in the same Mbit as the prime memory cells corresponding to the memory address or to redundant included in an immediately adjacent Mbit. For example, with reference to FIG. 4A, the memory addresses for rows of memory 415 and 417 in Mbit 410(1) have been remapped to redundant memory 415R and 417R, respectively. The redundant memory 415R is also in Mbit 410(1) (e.g., the same Mbit at row of memory 415), but the redundant memory 417R is in Mbit 410(2) (e.g., an Mbit immediately adjacent to Mbit 410(1)).

An example access operation is shown in FIGS. 4A and 4B for a memory address associated with prime memory in the Mbit 410(1), in particular, the memory address associated with row of memory 417. The example access operation will also be described with reference to FIG. 3. Due to the Mbit 410(1) including memory addresses that have been remapped to redundant memory (e.g., memory addresses of corresponding rows of prime memory 415 or 417), it is possible that the memory cells that should be accessed for the memory address may be included in Mbit 410(1) and Mbit 410(2).

The memory address for row of memory 417 is received by redundant address circuit 300 and compensation control circuits 310 and 320. Based on the memory address, the compensation control circuits 310 and 320 activate compensation circuits to perform sense amplifier compensation for the sense amplifiers 420(1), 420(2), and 420(3), given that prime and/redundant memory in Mbit 410(1) and Mbit 410(2) may be accessed, as previously described. The operation of sense amplifier compensation is performed concurrently with the redundant address circuit 300 comparing the memory address with redundant memory address information to determine whether the memory address has been remapped to redundant memory.

Following the memory address comparison, the redundant address circuit 300 provides precharge signals PRE to the compensation control circuits 310 and 320 to precharge the sense amplifiers that are not used to access memory for the memory address. In the present example, as previously described, the memory address associated with row of memory 417 has been remapped to redundant memory, in particular, to redundant memory 417R included in Mbit 410(2). As a result, the redundant address circuit 300 provides precharge signals PRE to compensation control circuits 310 and 320 to precharge the sense amplifiers 420(1) and continue operation of sense amplifiers 420(2) and 420 (3). The sense amplifiers 420(1) may be precharged (e.g., returned to a state prior to being compensated) because the memory cells to be accessed for the memory address of row of memory 417 are included in Mbit 410(2). As previously described, the sense amplifiers 420(2) and 420(3) are used to access memory of Mbit 410(2). The redundant memory 417R is accessed using the sense amplifiers 420(2) and/or 420(3).

Figure 5A:
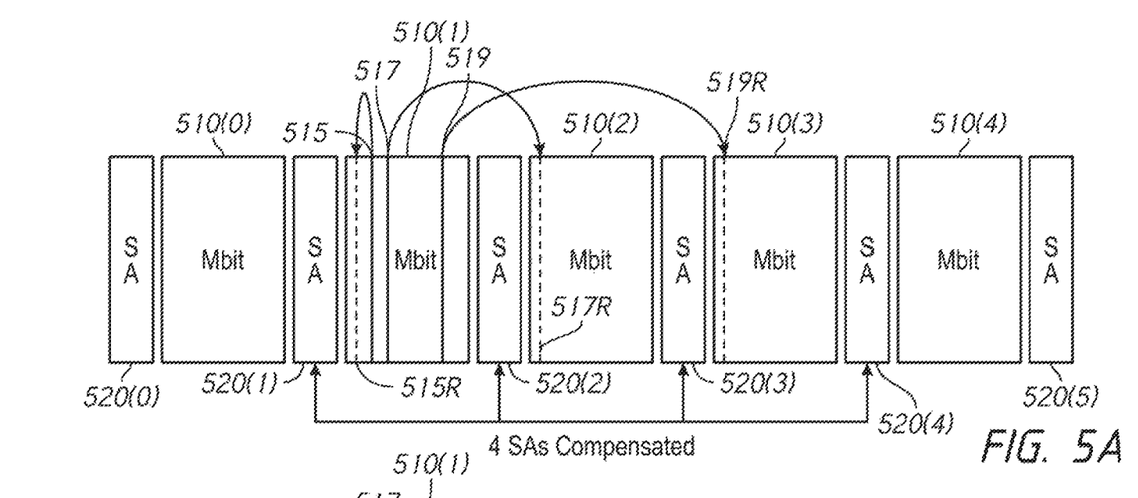
FIGS. 5A and 5B are diagrams of a portion of a memory cell array and sets of sense amplifiers for an example operation according to an embodiment of the disclosure.
Figure 5B:
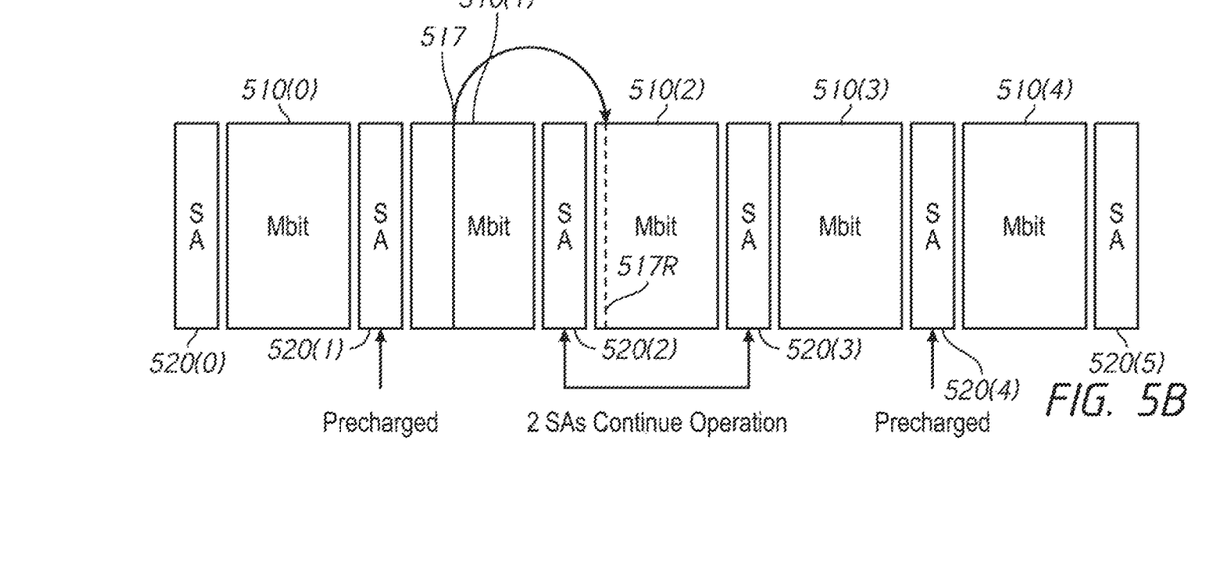

FIGS. 5A and 5B are diagrams of a portion of a memory cell array and sets of sense amplifiers for an example operation according to an embodiment of the disclosure. The memory cell array may be included in the memory cell array 145 of FIG. 1 and the sets of sense amplifiers may be included in the semiconductor device 100 in some embodiments of the disclosure.

The memory cell array is divided into memory cell sub-arrays (Mbit) 510(0)-510(4) which each include memory cells that may be accessed as rows and columns of memory. Each of the Mbits 510 include both prime memory and redundant memory.

Sets of sense amplifiers 520(0)-520(5) are shared by the Mbits 510 to access the memory cells. For example, the sense amplifiers 520(1) are used when accessing some of the memory cells in Mbit 510(0) and some of the memory cells in Mbit 510(1), the sense amplifiers 520(2) are used when accessing other ones of the memory cells in Mbit 510(1) and some of the memory cells in Mbit 510(2), the sense amplifiers 520(3) are used when accessing other ones of the memory cells in Mbit 510(2) and some of the memory cells in Mbit 510(3), and the sense amplifiers 520(4) are used when accessing other ones of the memory cells in Mbit 510(3) and some of the memory cells in Mbit 510(4). The sense amplifiers 520(0) are used when accessing other ones of the memory cells in Mbit 510(0) and the sense amplifiers 520(5) are used when accessing other ones of the memory cells in Mbit 510(4). In some embodiments of the disclosure, the sense amplifiers may have open digit line architecture. That is, the sense amplifiers may be coupled to a pair of digit lines, with each digit line extending into a different Mbit 510. In some embodiments, a set of sense amplifiers 520 includes prime memory sense amplifiers and redundant memory sense amplifiers.

In some embodiments of the disclosure, a memory address is limited to being remapped to redundant memory included in the same Mbit as the prime memory cells corresponding to the memory address or to redundant memory included within two adjacent Mbits. For example, with reference to FIG. 5A, the memory addresses for rows of memory 515, 517, and 519 in Mbit 510(1) have been remapped to redundant memory 515R, 517R, and 519R, respectively. The redundant memory 515R is in Mbit 510(1) (e.g., the same Mbit at row of memory 515), the redundant memory 517R is in Mbit 510(2) (e.g., an Mbit one over from Mbit 510(1)), and the redundant memory 519R is in Mbit 510(3) (e.g., an Mbit two over from Mbit 510(1)).

An example access operation is shown in FIGS. 5A and 5B for a memory address associated with prime memory in the Mbit 510(1), in particular, the memory address associated with row of memory 517. The example access operation will also be described with reference to FIG. 3. Due to the Mbit 510(1) including memory addresses that have been remapped to redundant memory (e.g., memory addresses corresponding to rows of prime memory 515, 517, or 519), it is possible that the memory cells that should be accessed for the memory address may be included in Mbit 510(1), Mbit 510(2), and Mbit 510(3).

The memory address for row of memory 517 is received by redundant address circuit 300 and compensation control circuits 310 and 320. Based on the memory address, the compensation control circuits 310 and 320 activate compensation circuits to perform sense amplifier compensation for the sense amplifiers 520(1), 520(2), 520(3), and 520(4), given that prime and/or redundant memory in Mbit 510(1), 510(2), and Mbit 510(3) may be accessed, as previously described. The operation of sense amplifier compensation is performed concurrently with the redundant address circuit 300 comparing the memory address with redundant memory address information to determine whether the memory address has been remapped to redundant memory.

Following the memory address comparison, the redundant address circuit 300 provides precharge signals PRE to the compensation control circuits 310 and 320 to precharge the sense amplifiers that are not used to access memory for the memory address. In the present example, as previously described, the memory address associated with row of memory 517 has been remapped to redundant memory, in particular, to redundant row of memory 517R included in Mbit 510(2). As a result, the redundant address circuit 300 provides precharge signals PRE to compensation control circuits 310 and 320 to precharge the sense amplifiers 520(1) and 520(4) and continue operation of sense amplifiers 520 (2) and 520(3). The sense amplifiers 520(1) and 520(4) may be precharged (e.g., returned to a state prior to being compensated) because the memory cells to be accessed for the memory address of row of memory 517 are included in Mbit 510(2). As previously described, the sense amplifiers 520(2) and 520(3) are used to access memory of Mbit 510(2). The row of redundant memory 517R is accessed using the sense amplifiers 520(2) and/or 520(3).

As shown by the example operations described with reference to FIGS. 4A and 4B, and with reference to FIGS. 5A and 5B, sense amplifier compensation may be performed concurrently with comparison of a memory address with redundant memory address information. Additionally, sets of sense amplifiers used to access prime memory and also redundant memory may be concurrently compensated. Based on results from the address comparison, some of the sense amplifiers may be precharged because they are not used to access the memory cells corresponding to the memory address.

Figure 6:
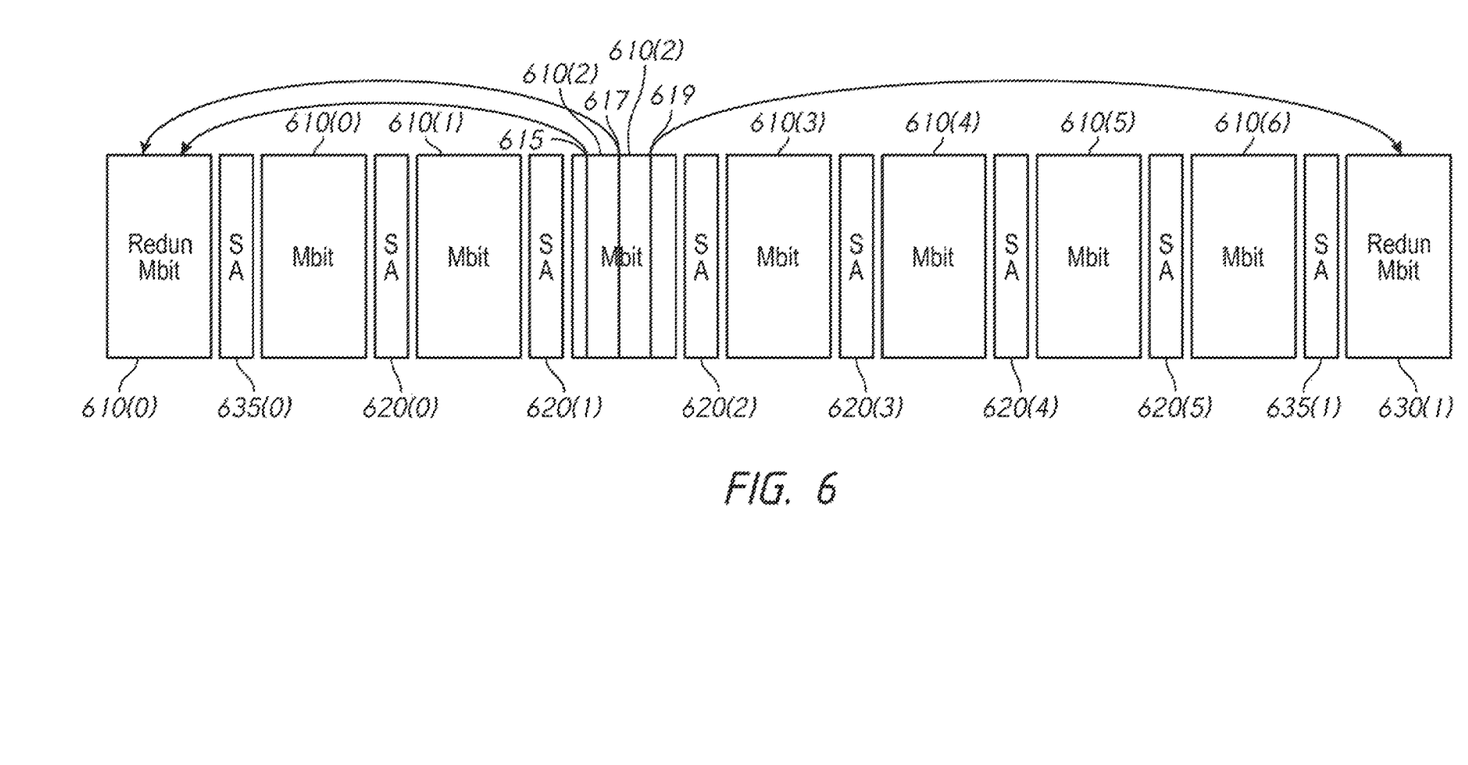
FIG. 6 is diagrams of a portion of a memory cell array and sets of sense amplifiers for an example operation according to an embodiment of the disclosure.

FIG. 6 is diagrams of a portion of a memory cell array and sets of sense amplifiers for an example operation according to an embodiment of the disclosure. The memory cell array may be included in the memory cell array 145 of FIG. 1 and the sets of sense amplifiers may be included in the semiconductor device 100 in some embodiments of the disclosure.

The memory cell array is divided into memory cell sub-arrays (Mbit) 610(0)-610(5) which each include memory cells that may be accessed as rows and columns of memory. The Mbits 610(0)-610(5) include prime memory. The Mbits 610(0)-610(5) may also include redundant memory in some embodiments of the disclosure. The memory cell array further includes redundant memory cell sub-arrays (Redun Mbit) 630(0) and 630(1). The Redun Mbits 630(0) and 630(1) include redundant memory to which memory addresses may be mapped, for example, when prime memory corresponding to a memory address is defective.

Sets of sense amplifiers 620(0)-620(5) are shared by the Mbits 610 to access the memory cells. For example, the sense amplifiers 620(0) are used when accessing some of the memory cells in Mbit 610(0) and some of the memory cells in Mbit 610(1), the sense amplifiers 620(1) are used when accessing other ones of the memory cells in Mbit 610(1) and some of the memory cells in Mbit 610(2), the sense amplifiers 620(2) are used when accessing other ones of the memory cells in Mbit 610(2) and some of the memory cells in Mbit 610(3), the sense amplifiers 620(3) are used when accessing other ones of the memory cells in Mbit 610(3) and some of the memory cells in Mbit 610(4), the sense amplifiers 620(4) are used when accessing other ones of the memory cells in Mbit 610(4) and some of the memory cells in Mbit 610(5), and the sense amplifiers 620(5) are used when accessing other ones of the memory cells in Mbit 610(5) and some of the memory cells in Mbit 610(6). The sense amplifiers 635(0) are used when accessing other ones of the memory cells in Mbit 610(0) and accessing redundant memory cells in Redun Mbit 630(0). The sense amplifiers 635(1) are used when accessing other ones of the memory cells in Mbit 610(6) and accessing redundant memory cells in Redun Mbit 630(1). In some embodiments of the disclosure, the sense amplifiers may have open digit line architecture. That is, the sense amplifiers may be coupled to a pair of digit lines, with each digit line extending into a different Mbit. In some embodiments, a set of sense amplifiers 635 includes prime memory sense amplifiers and redundant memory sense amplifiers.

In some embodiments of the disclosure, redundant memory may be consolidated into a limited number of Mbits and may be accessed using a limited number of sets of sense amplifiers. For example, in the embodiment of FIG. 6, the redundant memory for the memory cell array is included in Mbits 630(0) and Mbits 630(1), which can be accessed using sense amplifiers 635(0) and sense amplifiers 635(1), respectively. Thus, in order to access memory related to any memory addresses for the Mbits 610(0)-610(5), the sense amplifiers 635(0) and 635(1) may be compensated concurrently with the sense amplifiers 620 that will be used to access the Mbit 610 which includes the prime memory associated with a memory address. Additionally, the sense amplifiers 620 and 635 may be compensated concurrently with a redundant address circuit comparing the memory address with redundant memory address information.

In embodiments having redundant memory consolidated as previously described, memory addresses may be limited to being mapped to the consolidated redundant memory. For example, with reference to FIG. 6, the memory addresses for rows of memory 615 and 617 have been remapped to redundant memory included in Redun Mbit 630(0), and the memory address for row of memory 619 has been remapped to redundant memory included in Mbit 630(1).

An example access operation is shown in FIG. 6 for a memory address associated with prime memory in the Mbit 610(2). The example access operation will also be described with reference to FIG. 3. Due to the Mbit 610(2) including memory addresses that have been remapped to redundant memory (e.g., memory cells of rows of memory 615, 617, and 619), it is possible that the memory cells that should be accessed for the memory address may be included in Mbit 610(2), and also in Redun Mbits 630(0) and 630(1).

The memory address for row of memory 617 is received by redundant address circuit 300 and compensation control circuits 310 and 320. Based on the memory address, the compensation control circuits 310 and 320 activate compensation circuits to perform sense amplifier compensation for the sense amplifiers 620(1) and 620(2), and 635(0) and 635(1), given that memory in Mbit 610(2), and Redun Mbits 630(0) and 630(1) may be accessed, as previously described. The operation of sense amplifier compensation is performed concurrently with the redundant address circuit 300 comparing the memory address with redundant memory address information to determine whether the memory address has been remapped to redundant memory.

Following the memory address comparison, the redundant address circuit 300 provides precharge signals PRE to the compensation control circuits 310 and 320 to precharge the sense amplifiers that are not used to access memory for the memory address. In the present example, as previously described, the memory address associated with row of memory 617 has been remapped to redundant memory, in particular, to redundant memory included in Redun Mbit 630(0). As a result, the redundant address circuit 300 provides precharge signals PRE to compensation control circuits 310 and 320 to precharge the sense amplifiers 620(1) and 620(2), and 635(1), and continue operation of sense amplifiers 635(0). The sense amplifiers 620(1) and 620(2), and 635(1) may be precharged (e.g., returned to a state prior to being compensated) because the memory cells to be accessed for the memory address of row of memory 517 are included in Redun Mbit 630(0). As previously described, the sense amplifiers 635(0) are used to access redundant memory of Redun Mbit 630(0). The row of memory in Redun Mbit 630(0) to which the memory address for the row of memory 517 is mapped is accessed using the sense amplifiers 635(0).

In embodiments of the disclosure where the redundant memory is consolidated into a limited number of Mbits (e.g., Redun Mbits 630(0) and 630(1)), the number of sets of sense amplifiers that are compensated concurrently with sense amplifiers for accessing prime memory may be limited (e.g., sense amplifiers 635(0) and 635(1)). By limiting the number of sense amplifiers compensated in addition to the sense amplifiers for accessing prime memory, additional power consumed for concurrent sense amplifier compensation may be reduced compared to compensating a greater number of sets of sense amplifiers. In some embodiments of the disclosure, redundant memory is consolidated into one Mbit, and one corresponding set of sense amplifiers may be compensated in addition to the sense amplifiers used for accessing prime memory corresponding to a memory address.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
   a memory array including prime memory and redundant memory;
   prime memory sense amplifiers used to access the prime memory;
   redundant memory sense amplifiers used to access the redundant memory;
   a redundant address circuit configured to compare received memory addresses with redundant memory address information that identifies memory addresses remapped from prime memory to redundant memory;
   a first sense amplifier compensation control circuit configured to control threshold voltage compensation for the prime memory sense amplifiers; and
   a second sense amplifier compensation control circuit configured to control threshold voltage compensation for the redundant memory sense amplifiers,
   wherein the first and second sense amplifier compensation control circuits control threshold voltage compensation to compensate the prime memory sense amplifiers and the redundant memory sense amplifiers concurrently, and to precharge the prime memory sense amplifiers or the redundant memory sense amplifiers based on the address comparison by the redundant address circuit.

2. The apparatus of claim 1 wherein the first and second sense amplifier compensation control circuits further control threshold voltage compensation to precharge the prime memory sense amplifiers or the redundant memory sense amplifiers based on the address comparison by the redundant address circuit.

3. The apparatus of claim 1 wherein the memory array comprises a plurality of memory cell sub-arrays, each of the plurality of memory cell sub-arrays including prime memory and respective redundant memory.

4. The apparatus of claim 3 wherein a set of sense amplifiers includes prime memory sense amplifiers and redundant memory sense amplifiers, and the set of sense amplifiers are shared by two adjacent memory cell sub-arrays of the plurality of memory cell sub-arrays.

5. The apparatus of claim 3 wherein memory addresses corresponding to prime memory of a memory cell sub-array of the plurality of memory cell sub-arrays are limited to remapping to respective redundant memory of the same memory cell sub-array and immediately adjacent memory cell sub-arrays.

6. The apparatus of claim 3 wherein memory addresses corresponding to prime memory of a memory cell sub-array of the plurality of memory cell sub-arrays are limited to remapping to respective redundant memory of the same memory cell sub-array and within two adjacent memory cell sub-arrays.

7. The apparatus of claim 1 wherein the memory array comprises a plurality of prime memory cell sub-arrays, each of the plurality of memory cell sub-arrays including prime memory, the memory array further comprising a redundant memory sub-array including the redundant memory.

8. The apparatus of claim 1 wherein the prime memory sense amplifiers and the redundant memory sense amplifiers have open digit line architecture.

9. The apparatus of claim 1 wherein the redundant address circuit is configured to provide an output having a first logic level when a received memory address matches the redundant memory address information and to provide the output having a second logic level when the received memory address does not match the redundant memory address information.

10. An apparatus, comprising:
prime memory sense amplifiers including threshold voltage compensation circuits configured to compensate the prime memory sense amplifiers;
redundant memory sense amplifiers including threshold voltage compensation circuits configured to compensate the redundant memory sense amplifiers;
a redundant address circuit configured to compare memory addresses with defective memory addresses to determine whether a memory address has been remapped to redundant memory; and
sense amplifier compensation control circuits configured to control the threshold voltage compensation circuit to concurrently compensate the respective sense amplifiers before the redundant address circuit has determined whether the memory address has been remapped to redundant memory and further configured to cause at least one of the prime memory sense amplifiers and the redundant memory sense amplifiers to return to a state prior to being compensated after the redundant address circuit has determined whether the memory address has been remapped to redundant memory.

11. The apparatus of claim 10 wherein the threshold voltage compensation circuits of the redundant memory sense amplifiers and the threshold voltage compensation circuits of the prime memory sense amplifiers compensate the respective sense amplifiers during comparison of the memory address with defective memory addresses by the redundant address circuit.

12. The apparatus of claim 10 wherein the sense amplifier compensation control circuits are configured to return the prime memory sense amplifiers to the state prior to being compensated when the redundant address circuit determines the memory address is remapped to redundant memory and wherein the sense amplifier compensation control circuits are configured to return the redundant memory sense amplifiers to the state prior to being compensated when the redundant address circuit determines the memory address is not remapped to redundant memory.

13. The apparatus of claim 10 wherein a set of sense amplifiers includes a portion of the prime memory sense amplifiers and a portion of the redundant memory sense amplifiers.

14. A method, comprising:
receiving a memory address;
concurrently compensating prime memory sense amplifiers and redundant memory sense amplifiers;
comparing the memory address to redundant memory address information to determine whether the memory address matches the redundant memory address information; and
precharging either the redundant memory sense amplifiers or the prime memory sense amplifiers based at least in part on the comparison of the memory address to redundant memory address information.

15. The method of claim 14 wherein compensating prime memory sense amplifiers and redundant memory sense amplifiers comprises compensating threshold voltage difference between components of the prime memory sense amplifiers and compensating threshold voltage difference between components of the redundant memory sense amplifiers.

16. The method of claim 14 wherein precharging the redundant memory sense amplifiers comprises returning the redundant memory sense amplifiers to an inactive state and wherein precharging the prime memory sense amplifiers comprises returning the prime memory sense amplifiers to an inactive state.

17. The method of claim 14 wherein the prime memory corresponding to the memory address is included in a memory cell sub-array that also includes redundant memory.

18. The method of claim 14 wherein:
the redundant memory sense amplifiers are precharged responsive to the memory address not matching redundant memory address information; and
the prime memory sense amplifiers are precharged responsive to the memory address matching redundant memory address information.

19. The method of claim 14, further comprising:
accessing prime memory corresponding to the memory address responsive to the memory address not matching redundant memory address information; and
accessing redundant memory to which the memory address is mapped responsive to the memory address matching redundant memory address information.

20. The method of claim 14 wherein compensating prime memory sense amplifiers comprises compensating a plurality of prime memory sense amplifiers that are shared by a plurality of memory cell sub-arrays.

* * * * *